United States Patent [19]

Opschoor et al.

[11] Patent Number: 4,954,971
[45] Date of Patent: Sep. 4, 1990

[54] BIDIMENSIONAL LASER ARRAY WITH TWO GROUPS OF ACTIVE REGIONS

[75] Inventors: Jan Opschoor; Carolus J. van der Poel; Henri F. J. van 't Blik, all of Eindhoven, Netherlands

[73] Assignee: U.S. Philips Corp., New York, N.Y.

[21] Appl. No.: 315,010

[22] Filed: Feb. 23, 1989

[30] Foreign Application Priority Data

Feb. 29, 1988 [NL] Netherlands ............... 8800509

[51] Int. Cl.$^5$ .............................................. H01S 3/19
[52] U.S. Cl. .................................. 372/50; 372/45; 372/46
[58] Field of Search ................ 372/50, 46, 45, 44, 372/43

[56] References Cited

U.S. PATENT DOCUMENTS

| | | | |
|---|---|---|---|
| 4,426,704 | 1/1984 | Nagai et al. | 372/50 |
| 4,627,065 | 12/1986 | Logan et al. | 372/50 |
| 4,641,311 | 2/1987 | Ackley | 372/50 |
| 4,751,709 | 6/1988 | Matsumoto et al. | 372/50 |
| 4,803,691 | 2/1989 | Scifres et al. | 372/50 |

Primary Examiner—William L. Sikes
Assistant Examiner—Georgia Y. Epps
Attorney, Agent, or Firm—Steven R. Biren

[57] ABSTRACT

A semiconductor diode laser array, in which the active regions (3) are arranged in at least two groups, which are located in (two) substantially equidistant planes (V and W). At least one of the groups should comprise at least two active regions.

According to the invention, the active regions (3) of one group located in the plane V are fully separated by at least one of the enclosure layers, for example the enclosure layers 2 and 4 (FIG. 1) or the enclosure layer 4 (FIG. 4) from the active regions 3 of the other group located in the plane W.

7 Claims, 3 Drawing Sheets

BIDIMENSIONAL LASER ARRAY WITH TWO GROUPS OF ACTIVE REGIONS

BACKGROUND OF THE INVENTION

The invention relates to a semiconductor diode laser array comprising a semiconductor layer structure having a number of substantially parallel strip-shaped active regions each located between two enclosure layers having a larger band gap and a smaller refractive index for the radiation produced than the active region, which active regions are disposed within a resonant cavity and constitute at least two groups located in two substantially equidistant planes, at least one of the groups comprising at least two active regions.

Such semiconductor diode layer arrays are suitable radiation sources for inter alia data processing systems, such as laser printers, by means of which information is written, and such as "optical disk" systems, in which information is read out—for example so-called compact disk (CD) and Video Long Play (VLP) players—or written and read out—for example digital optical recording (DOR).

A semiconductor diode laser array of the kind described above is known from British Patent Application published under No. GB 2164206 A. In this document, a semiconductor diode laser array is described, in which an active layer is provided between two enclosure layers on a substrate provided with mesa-shaped strips between which channels are disposed. The strip-shaped active regions of the semiconductor diode lasers are disposed alternately on the upper side of the mesa-shaped strip and on the bottom of the channel located between two of these strips. Both the active layer and the two enclosure layers of each semiconductor laser extend continuously over the edges of the mesa-shaped strip and thus connect the active region of each laser to the active region of adjacent layers, although these layers are slightly thinner at the edges than elsewhere. By means of the slightly thicker part of the active layer at the edges, the radiation produced in an active region of a semiconductor diode laser is coupled in phase to the radiation produced in the active regions of the adjacent semiconductor diode lasers.

A disadvantage of the known device is that both due to the leakage of radiation from the active region of a semiconductor diode laser to the active layer between two semiconductor diode lasers and due to parasitic emission in the last-mentioned part of the active layer the starting current of the device is fairly high.

A further disadvantage of this known laser array resides in the fact that the positioning of the semiconductor diode lasers located on top of the mesas with respect to the semiconductor diode lasers located on the bottom of the channels is fixed within certain limits determined by the geometry; thus, for example, it is not possible to arrange four semiconductor diode lasers pairwise accurately one above the other so that a 2+2 symmetrical matrix is obtained. For the given 2+2 array, this can mean that a non-optimal symmetrical far field is obtained.

SUMMARY OF THE INVENTION

The present invention has inter alia for its object to provide a bidimensional semiconductor diode laser array preferably coupled in phase and having a high power, a low starting current, a high packing density and a symmetrical far field with low aperture.

The invention is based inter alia on the recognition of the fact that the object aimed at can be achieved by means of an array of semiconductor diode lasers, of which the active regions are arranged in a given manner with respect to each other.

According to the invention, for this purpose a semiconductor diode laser array of the kind described above is characterized in that the active regions of one group are fully separated by at least one of the enclosure layers from the active regions of the other group. Thus, the starting current of the semiconductor diode laser array can be lower than that of the known device, as already stated above. Furthermore, this characteristic means that the active regions of the various groups can form part of different active layers. This results in that in such an embodiment the position of the active regions of one group no longer depends upon the position of the active regions of the other group and that enlargement of the number of groups is not necessarily at the expense of the relative distance of the active regions within a group. As a result, the packing density and the symmetry can remain a maximum. Thus, for example, a 2+2 array will have a maximum symmetry when the active regions of one group are located accurately above the active regions of the other group, whereas this is achieved, for example, for a 2+1 array when the active regions of one semiconductor diode laser is located accurately above the region between the active regions of the remaining two semiconductor diode lasers.

These two examples may readily be replaced by other examples with larger numbers of groups and larger numbers of semiconductor diode lasers per group; the reasoning then remains unchanged.

As will appear from the embodiments to be given hereinafter, at least two preferred embodiments can be distinguished, which are different as to their suitability for use with larger numbers of groups.

In a first preferred embodiment, use is made of an enclosure layer in which mesa-shaped strips alternating with strip-shaped channels are provided. The active regions of one group are located on the upper side of the mesa-shaped strips and the active regions of the other group are located on the bottom of the channels. This embodiment is not limited to arrays consisting of two groups. When the channels are wider than the mesa-shaped strips, the bottom thereof can be provided again with other (narrower) channels. Other forms, such as wide mesa-shaped strips in which shallow channels are provided alternating with deeper channels, are included in this embodiment. For a further explanation, reference may be made to the Figures and the associated description. An advantage of this embodiment is inter alia that the manufacture requires only a two-step epitaxy process with regard to the epitaxial part.

A second embodiment is characterized by a semiconductor substrate which is provided with a stack of semiconductor layers consisting alternately of an enclosure layer and an active layer, the active regions of one group each time forming part of one active layer.

BRIEF DESCRIPTION OF THE DRAWING

The invention will now be described more fully with reference to two embodiments and the accompanying drawings, in which.

Figure 1:
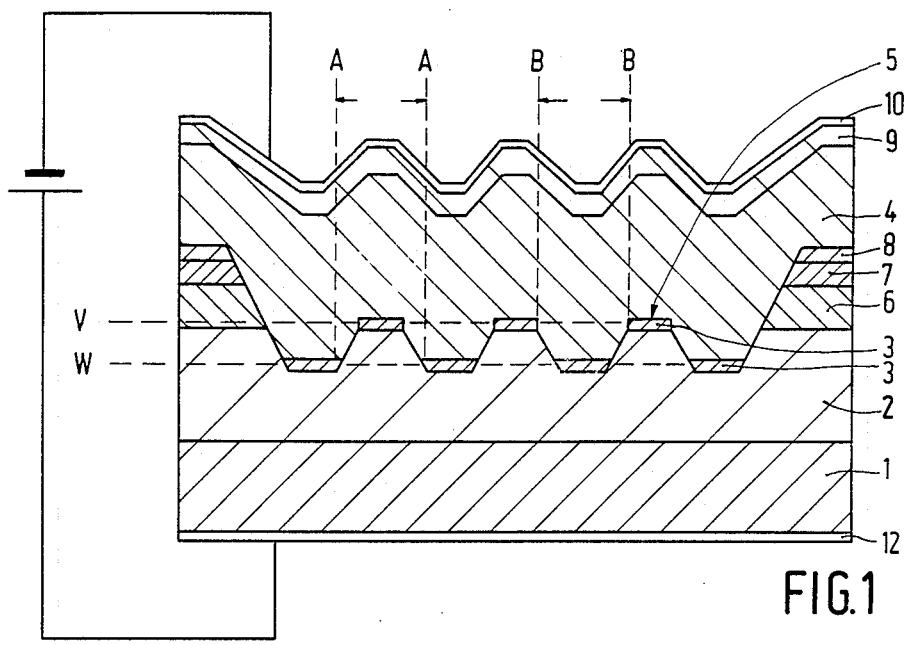
FIG. 1 shows diagrammatically and in cross-section a bidimensional array semiconductor diode laser according to the invention in a first preferred embodiment.

The Figures are schematic and not drawn to scale, and the dimensions in the direction of thickness are exaggerated for the sake of clarity. Corresponding parts are generally designated by the same reference numerals in the different embodiments. Semiconductor regions of the same conductivity type are generally cross-hatched in the same direction.

DESCRIPTION OF THE PREFERRED EMBODIMENTS

FIG. 1 shows diagrammatically in cross-section a 4+3 array of semiconductor diode lasers according to the invention in a first preferred embodiment. The semiconductor diode laser array comprises a semiconductor body having a substrate region 1 of a first—in this case the p—conductivity type provided with a connection conductor 12 and consisting in this embodiment of monocrystalline gallium arsenide. On this substrate is arranged a semiconductor layer structure comprising inter alia a first enclosure layer 2 of the same—so in this case the p—conductivity type, in which a number—in this case three—of mesa-shaped strips AA are formed. Between these strips are located in the enclosure layer 2 channels BB—in this case four—, the sides of which are constituted by the edges of the said mesa-shaped strips. The semiconductor layer structure further comprises a number—in this case seven—of substantially parallel mesa-shaped active regions 3, which in this embodiment are of the p-conductivity type and are only weakly doped. These active regions 3 are each located between the first enclosure layer 2 and a second enclosure layer 4 of a conductivity type opposite to that of the first enclosure layer—in this case the n-type. The longitudinal axis of the strip-shaped active regions is at right angles to the plane of the drawing and two reflecting crystal surfaces, mostly preferential cleavage surfaces, extend parallel to this plane. These so-called mirror surfaces constitute in the longitudinal direction a Fabry-Pérot resonant cavity, within which the strip-shaped active regions are disposed. Further, a pn junction 5 is present near the junction between each active region 3 and the enclosure layer 4. With a sufficiently large current strength in the forward direction, this pn junction 5 can lead to emission of electromagnetic radiation in the active region 3.

The strip-shaped active regions constitute two groups which are located in two planes V and W which are substantially at right angles to the plane of the drawing and are substantially equidistant. The plane V substantially coincides with the upper surface of the mesa-shaped strips and comprises a group of (in this embodiment) three active regions, while the plane W, which substantially coincides with the bottom of the channels, comprises another group of in this embodiment four active regions. Besides the two groups of active regions 3 and between the enclosure layers 2 and 4 is arranged a stack of the following semiconductor layers: a first passive layer 6 having a conductivity type opposite to that of the enclosure layer 2, so in this case the n-type, a second passive layer 7 having a conductivity type opposite to that of the second enclosure layer, so in this case the p-type, and a third passive layer 8 having the same conductivity type as the active regions 3, in this case the p-conductivity type. The second enclosure layer 4 is covered by a contact layer 9, in this case of the n-conductivity type, which is provided with a connection conductor 10 and consists in this embodiment of gallium arsenide. All the remaining semiconductor layers in this embodiment consist of aluminum gallium arsenide. The aluminum content of the active regions 3 and of the passive layer 8, in this embodiment 10 at .%, corresponds to a wavelength of 780 nm for any radiation produced. The aluminum content of the enclosure layers 2 and 4 and of the passive layers 6 and 7, in this embodiement 50 at .%, is such that the band width is larger and accordingly the refractive index with respect to the radiation produced is smaller than the corresponding quantities of the active regions 3.

According to the invention, the active regions of one group located in the plane V are fully separated from the active regions of the other group lying in the plane W by at least one of the enclosure layers, in this embodiment by the enclosure layers 2 and 4.

Due to the construction of the semiconductor layer structure according to the invention, in which in this embodiment the active regions within a group are also fully separated from each other by an enclosure layer, i.e. the layer for the group in the plane V and the layer 2 for the group in the plane W, the threshold current of the device is comparatively low. This is due to the absence of parasitic emission outside the active regions and to the fact that radiation does not leak out of the active regions. In the semiconductor diode laser array according to this embodiment, the passive layers 7 and 8 constitute a rectifying junction, which, when the pn junction 5 is connected in the forward direction, is connected in the reverse direction and thus limits the current spread within the active regions 3.

In this embodiment, the following compositions, dopings and thicknesses are used for the various semiconductor layers.

| Layer | Semiconductor | Type | Doping concentr. (at/cm$^3$) | Thickness ($\mu$m) | Refractive index ($\lambda$ = 780 nm) |
|---|---|---|---|---|---|
| 1 | GaAs | p | $2 \times 10^{19}$ | — | — |
| 2 | Ga$_{0.50}$Al$_{0.50}$As | p | $2 \times 10^{18}$ | 6 | 3.26 |
| 3 | Ga$_{0.10}$Al$_{0.90}$As | p | — | 0.07 | 3.59 |
| 4 | Ga$_{0.50}$Al$_{0.50}$As | N | $2 \times 10^{18}$ | 6 | 3.26 |
| 6 | Ga$_{0.50}$Al$_{0.50}$As | N | $1 \times 10^{17}$ | 0.5 | 3.26 |
| 7 | Ga$_{0.50}$Al$_{0.50}$As | p | $1 \times 10^{17}$ | 0.5 | 3.26 |
| 8 | Ga$_{0.10}$Al$_{0.90}$As | p | — | 0.07 | 3.59 |
| 9 | GaAs | N | $3 \times 10^{18}$ | 1 | — |

The radiation emitted by this semiconductor diode laser array has a wavelength of about 780 nm. The width of the active regions is about 3 $\mu$m, while the distance between the planes V and W is about 2.5 $\mu$m and the center distance between two active regions within a group is about 6 $\mu$m. The electrode layer 10 on the contact layer 9 consisting of highly doped gallium arsenide consists, for example, of a gold-germanium-nickel layer, the use of which is common practice in gallium arsenide devices. The electrode layer 12 on the substrate 1 is, for example, a platinum-molybdenum-gold layer or a platinum-tantalum-gold layer.

Figure 2:
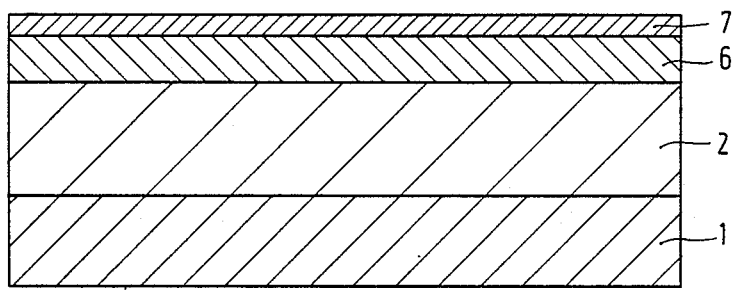
FIG. 2 shows diagrammatically and in cross-section the construction of the bidimensional array shown in FIG. 1 after the first growth process.

The semiconductor diode laser array described can be manufactured inter alia in the following manner (cf. also FIG. 2). The starting material is a substrate 1 of monocrystalline p-type gallium arsenide having a doping concentration of $2.10^{19}$ at/cm$^3$ and a thickness of, for example, 350 $\mu$m. After the surface, which preferably has a misorientation of at most 6° with respect to the (001) orientation, has been polished and etched, in order of succession a 6 $\mu$m thick layer 2 of p-type Al$_{0.50}$Ga$_{0.50}$As having a doping concentration of about $2.10^{18}$ at/cm$^3$, a 0.5 $\mu$m thick layer 6 of n-type Al$_{0.50}$Ga$_{0.50}$As having a doping concentration of about $1.10^{17}$ at/cm$^3$ and a 0.5 $\mu$m thick layer 7 of p-type Al$_{0.50}$Ga$_{0.50}$ having a doping concentration of about $1.10^{17}$ at/cm$^3$ are grown on this surface for example from the gaseous phase by means of OMVPE (Organo-Metallic Vapour Phase Epitaxy). A diagrammatic cross-section of the structure manufactured in this manner is shown in FIG. 2. This multilayer structure may also be grown from the liquid phase by means of LPE (=Liquid Phase Epitaxy), in which event the orientation of the substrate 1 is preferably substantially the (001) orientation. For details about the LPE technique, reference may be made to the book by D. Elwell and H. J. Scheel, Crystal Growth for High Temperature Solutions, Academic Press, 1975, especially to pp. 433–467. For details about the OMVPE technique, reference may be made to the survey article by M. J. Ludowise "Metal-Organic Chemical Vapour Deposition of III-V Semiconductors" in Journal of Applied Physics, 58 (1985), 31.

Figure 3:
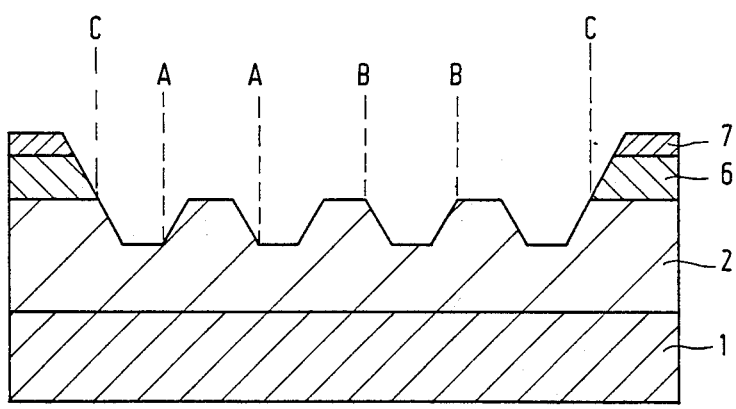
FIG. 3 shows diagrammatically and in cross-section the structure of the bidimensional array shown in FIG. 1 before the second growth process.

Subsequently, by means of commonly used photolithographic techniques and by means of an etching liquid consisting of H$_2$O, H$_2$O$_2$ (35%) and NH$_4$OH in a ratio of 100:2:1 as etchant the semiconductor layers 6 and 7 within the strip-shaped region CC are etched away in the surface of the layer 7 (cf. also FIG. 3).

Subsequently, by means of the same technique and by means of the aforementioned etchant, channels BB are provided in the upper side of the semiconductor layer 2. These channels have on the upper side a width of about 6 $\mu$m. The upper side of the mesa has a width of about 3 $\mu$m, while the distance of the upper side of the mesa from the bottom of a channel is about 2.5 $\mu$m. The channels are etched according to the invention in a manner in which the edges of the resulting mesa-shaped strips AA coincide with crystal surfaces of the gallium arsenide lattice, i.e. with the (111) As surfaces. A diagrammatic cross-section of the semiconductor layer structure resulting therefrom is shown in FIG. 3.

This structure is arranged again after cleaning in the OMVPE growing apparatus. First (cf. FIG. 1) the about 0.07 $\mu$m thick active regions 3 and the parts of the passive layer 8 consisting of Al$_{0.10}$Ga$_{0.90}$As to which no intentional dopings are added are grown. Due to the fact that no noticeable growth takes place on the (111) As surfaces, the edges of the mesa-shaped strips AA remain free from growth and the active regions 3 are formed on the upper side of the mesa-shaped strip and on the bottom of the channels. Subsequently, an about 6 $\mu$m thick n-type Al$_{0.50}$Ga$_{0.50}$As layer 4 is grown having a doping of $2.10^{18}$ at/cm$^3$, which layer constitutes the second enclosure layer. Since the rate of growth of this layer, which is considerably thicker than the active regions, is higher in the (311) crystal direction than in the (001) crystal direction, the channels are filled with the layer 4 notwithstanding the fact that during the process of growing this layer no direct growth takes place on the edges of the mesa-shaped strips. Subsequently, an about 1 $\mu$m thick contact layer consisting of gallium arsenide and having a doping of $3.10^{18}$ at/cm$^3$ is provided. Finally, after the layer structure has been taken out of the growth apparatus and has been cooled, the electrode layer 10 consisting, for example, of a gold-germanium-nickel layer is provided on the contact layer 9 and the electrode layer 12 consisting, for example, of a platinum-molybdenum-gold layer or a platinum-tantalum-gold layer is provided on the substrate 1 by means of, for example, sputtering. Thus, the structure of FIG. 1 is obtained.

It should be noted here that the semiconductor layers may also have a composition different from that mentioned here. This depends inter alia upon the desired wavelength of the radiation to be produced. Besides, especially the aluminum content of the enclosure layers may be varied in order to influence the enclosure and hence also the extent to which phase coupling can occur.

Figure 4:
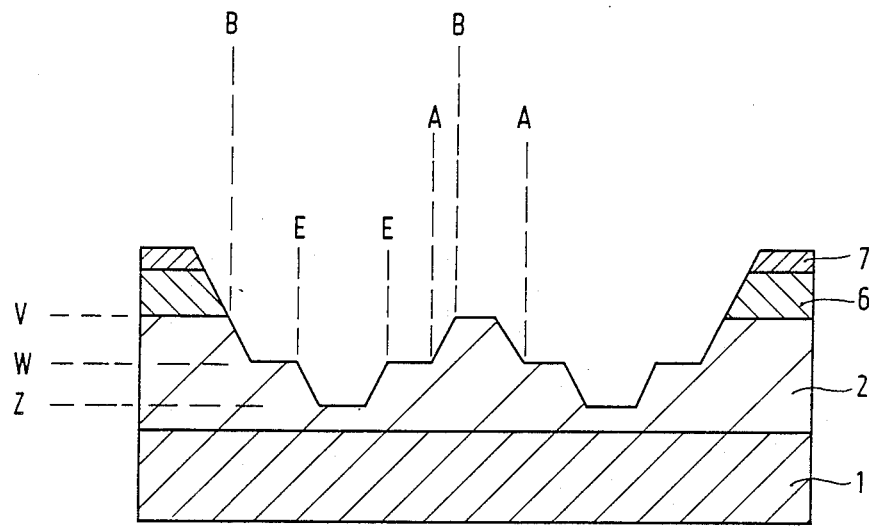
FIG. 4 shows diagrammatically and in cross-section the structure of the bidimensional array shown in FIG. 1 before the second growth process and for an example comprising three groups of active regions.
Figure 5:
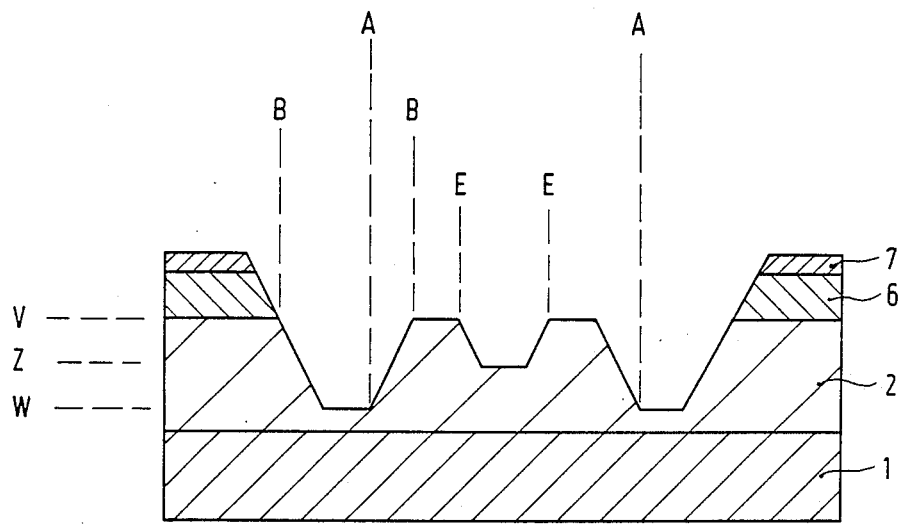
FIG. 5 shows diagrammatically and in cross-section the structure of the bidimensional array shown in FIG. 1 before the second growth process and for another example comprising three groups of active regions.

Other variations are also possible within this embodiment. FIGS. 4 and 5 show examples of the manner in which mesa-shaped strips and channels can be provided if, for example, an array comprising three groups of active regions located in three planes, i.e. V, W and Z, is desired. In a first form, shown in FIG. 4, for example the channels BB are wider than the mesa-shaped strips AA and the bottom of the channels is provided with channels EE, which are narrower than the channels BB. In a second form, shown in FIG. 5, wide mesa-shaped strips AA provided with shallow channels EE alternate with deeper channels BB.

A second embodiment of a semiconductor diode laser array according to the invention will now be described with reference to FIGS. 6 to 9.

Figure 6:
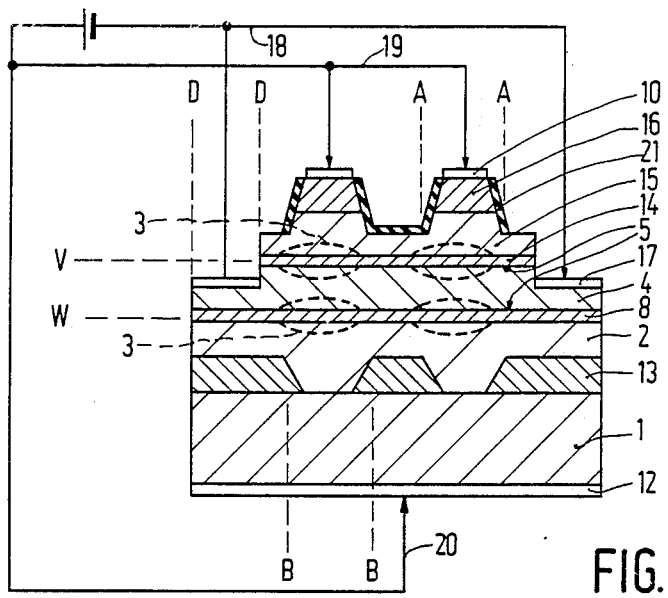
FIG. 6 shows diagrammatically and in cross-section a bidimensional array semiconductor diode laser according to the invention in a second preferred embodiment.

FIG. 6 shows diagrammatically in cross-section a 2+2 array of semiconductor diode lasers according to the invention in a second preferred embodiment. The semiconductor diode laser array comprises a semiconductor body having a substrate region 1 of a first, in this case p, conductivity type provided with a connection conductor 12 and consisting in this embodiment of monocrystalline gallium arsenide. A semiconductor layer structure comprising inter alia a number—in this case three—of strip-shaped current-blocking regions 13 of the opposite—in this case n—conductivity type is provided on this substrate region. The semiconductor layer structure further comprises a first enclosure layer 2 of the same conductivity type as the substrate 1, on which a first active layer 8, this embodiment of the p-conductivity type and not intentionally doped, is provided. On the active layer 8 is disposed a second enclosure layer 4 of the opposite, here n, conductivity type, on which a second active layer 14 is provided which, like the first active layer 8, is not intentionally doped and has the p-conductivity type. Further, the semiconductor layer structure comprises a third enclosure layer 15, here of the p-conductivity type, on which strip-shaped contact regions 16 are disposed, which constitute together with strip-shaped parts of the enclosure layer 15 the mesa-shaped strips AA. The contact regions 16 are of the p-conductivity type and are provided with a connection conductor 10 consisting of a titanium-gold layer. An insulating layer 21 consisting of silicon dioxide is disposed on the edges of and between the mesa-shaped strips AA. The semiconductor layer structure further comprises a number—in this case four—of substantially parallel strip-shaped active regions 3, which constitute two groups of each two active regions, which groups are located in two substantially equidistant planes V and W at right angles to the plane of the drawing, the plane V lying in the active layer 8 and the plane W lying in the active layer 14. The longitudinal axis of the strip-shaped regions 3 is at right angles to the plane of the drawing, while two reflecting crystal surfaces again extend parallel to this plane. The strip-shaped active regions are located within the Fabry-Pérot resonant cavity, which is constituted in the longitudinal direction by these mirror surfaces. Further, pn junction 5 is present near the junction between each active region 3 and the enclosure layer 4 and this pn junction leads with a sufficiently large current strength in the forward direction to emission of electromagnetic radiation in the active region 3. Both on the lefthand and on the righthand side of the semiconductor diode laser array the semiconductor body comprises a recess DD which reaches into the second enclosure layer 4 and is provided with a connection conductor 17 consisting in this embodiment of a gold germanium-nickel layer. The connection conductors 10 and 12 consist in this embodiment of a titanium-gold layer. The electrical connection scheme of the connection conductors comprises the line 18 for the connection conductor 17, the line 19 for the connection conductor 10 and the line 20 for the connection conductor 12.

In this embodiment, the strip-shaped current-blocking regions 13 and the contact regions 16 consist of gallium arsenide, while all the remaining semiconductor layers consist of aluminum gallium arsenide. The aluminum content of the active regions 3 is in this case 10 at .%, which corresponds to a wavelength of 780 nm for the radiation to be produced. The aluminum content of the enclosure layers 2, 4 and 15 is in this case 50 at .%, which is such that the band width is larger and accordingly the refractive index with respect to the radiation produced is smaller than the corresponding quantities of the active regions 3.

According to the invention, the active regions 3 of one group lying in the plane V are fully separated from the active regions 3 of the other group lying in the plane W by at least one of the enclosure layers, in this embodiment by the enclosure layer 4.

Due to the construction of the semiconductor layer structure according to the invention, the active regions 3 can be positioned so that in two substantially orthogonal directions phase coupling between the radiations produced in the active regions can occur: in the direction parallel to the planes V and W, within one group, due to the fact that the active regions lie in one active layer and that they lie at a relative distance of at most a few microns and in the other direction perpendicular to the planes V and W between two different groups due to the mutual positioning and the small distance (at most a few microns) of these groups.

In the semiconductor diode laser array according to this embodiment, the strip-shaped current-blocking regions 13 and the substrate 1 form a rectifying junction, which, when the pn junction 5 is connected in the forward direction, is connected in the reverse direction and thus limits the current spread outside the active regions 3 lying in the active layer 8. The geometry chosen results in that below the strip-shaped regions 16 and at the area of the active layer 14 a wave guide is formed, while this wave guide is obtained with regard to the active regions 3 lying in the active layer 8 by the strip-shaped regions 13.

In this embodiment, the following compositions, dopings and thicknesses are used for the various semiconductor layers:

| Layer | Semiconductor | Type | Doping concentr. (at/cm$^3$) | Thickness ($\mu$m) | Refractive index ($\lambda$ = 780 nm) |
|---|---|---|---|---|---|
| 1 | GaAs | P | $2 \times 10^{19}$ | — | — |
| 2 | Ga$_{0.50}$Al$_{0.50}$As | P | $2 \times 10^{18}$ | 1.3 | 3.26 |
| 4 | Ga$_{0.50}$Al$_{0.50}$As | N | $2 \times 10^{18}$ | 1.50 | 3.26 |
| 8 | Ga$_{0.10}$Al$_{0.90}$As | P | — | 0.07 | 3.59 |
| 13 | GaAs | N | $1 \times 10^{18}$ | 1 | — |
| 14 | Ga$_{0.10}$Al$_{0.90}$As | P | — | 0.07 | 3.59 |
| 15 | Ga$_{0.50}$Al$_{0.50}$As | P | $1 \times 10^{18}$ | 1.30 | 3.26 |
| 16 | GaAs | N | $5 \times 10^{18}$ | 1 | — |

The radiation emitted by this semiconductor diode laser array has a wavelength of about 780 nm. The width of the active regions 3, the strip-shaped regions 16 and the channels located between the strip-shaped regions 13 is about 3 $\mu$m. The center distance between the active regions 3 within one group is about 6 $\mu$m; the distance between the planes V and W and hence the distance between the active regions of different groups is about 1.5 $\mu$m. The electrode layers 10 and 12 consist, for example, of a titanium-gold layer, while the electrode layer 17 may consist, for example, of a gold-germanium-nickel layer.

Figure 7:
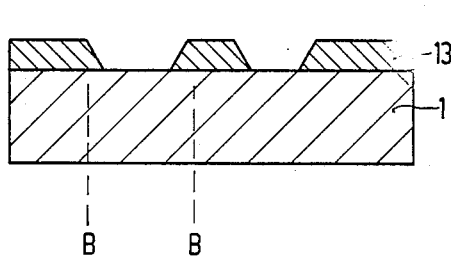
FIG. 7 shows diagrammatically an in cross-section the construction of the bidimensional array shown in FIG. 6 after the first growth process and after the formation of the strip-shaped current-blocking strips.
Figure 8:
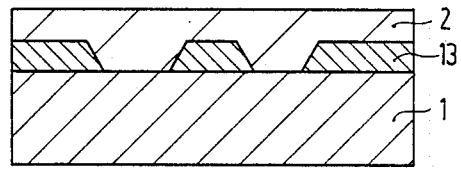
FIG. 8 shows diagrammatically and in cross-section the structure of the bidimensional array shown in FIG. 6 after the second growth process.
Figure 9:
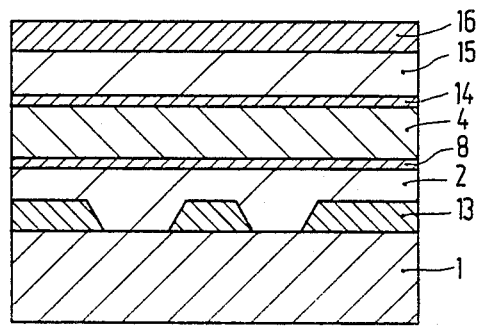
FIG. 9 shows diagrammatically and in cross-section the structure of the bidimensional array shown in FIG. 6 after the third growth process.

The semiconductor diode laser array described in this embodiment may be manufactured, for example, in the following manner (cf. also FIG. 7). The starting material is a substrate 1 of monocrystalline p-type gallium arsenide having a doping concentration of $2.10^{19}$ at/cm$^3$ and a thickness of, for example, 350 $\mu$m. After the surface, which preferably has the (001) orientation, has been polished and etched, a 1 $\mu$m thick layer 13 of n-type GaAs having a doping concentration of about $10^{18}$ at/cm$^3$ is provided on this surface, for example, from the liquid phase by means of LPE (=Liquid Phase Epitaxy). After cooling, the structure is removed from the growth apparatus and the—in this embodiment two—channels BB are etched into the layer 13 by means of conventional photolithographic techniques and with the aid of an etching liquid consisting of a mixture of $H_2O$, $H_2O_2$ (35%) and $NH_4OH$ (100:2: as etchant (cf. FIG. 7). After cleaning, the structure is arranged again in the growth apparatus (cf. FIG. 8).

First, a first enclosure layer 2 consisting of p-type $Al_{0.50}Ga_{0.50}As$ having a doping of $2.10^{18}$ at/cm$^3$ is now grown, which has between the strip-shaped regions 13 a thickness of 1.3 μm and has above the last-mentioned regions a thickness of 0.3 μm. Since the OMVPE (=Organo-Metallic Vapour Phase Epitaxy) growing technique is more suitable to grow successively several thin layers having accurately the same thickness and composition—as in this case the active layers 8 and 14—and since it is desirable for a satisfactory phase coupling that the optical and electrical properties of the active regions located in these active layers are as equal to each other as possible, the growing process is now preferably fixed by means of the OMVPE growing technique. After cooling and removal from the LPE growth apparatus, the structure is therefore arranged in an OMVPE growth apparatus (cf. FIG. 9). In this apparatus, a first about 0.07 μm thick active layer 8 consisting of $Al_{0.10}Ga_{0.90}As$ not intentionally doped is then provided. On this layer a second n-type enclosure layer 4 consisting of $Al_{0.50}Ga_{0.50}As$ having a doping of $2.10^{18}$ at/cm$^3$ and a thickness of 1.5 μm is grown. Subsequently, a second 0.07 μm thick active layer 14 consisting of not intentionally doped $Al_{0.10}Ga_{0.90}As$ is provided, on which a 1 μm thick third enclosure layer 15 consisting of p-type $Al_{0.50}Ga_{0.50}As$ having a doping of $1.10^{18}$ at/cm$^3$ and finally a 1 μm thick p-type GaAs layer having a doping of $5.10^{18}$ at/cm$^3$ are grown. With respect to the details of the said growing techniques LPE and OMVPE, reference may be made to the citations mentioned for the first embodiment.

After the growing process has been accomplished, the semiconductor layer structure (cf. FIG. 9) is removed from the growth apparatus and a thin layer of silicon dioxide is provided by means of, for example, sputtering. Subsequently the silicon dioxide and then the semiconductor material are locally removed as far as into the n-type $Al_{0.50}Ga_{0.50}As$ layer by means of photolithographic techniques and by means of conventional etchants so that the recesses DD are formed (cf. FIG. 6). By means of, for example, sputtering and with the use of photolithography and etching with usual etchants, for example on the basis of KJ and $I_2$, the electrode layer 14 consisting, for example, of a gold-germanium-nickel layer is provided. After the gold-germanium-nickel layer and the remaining silicon dioxide outside the regions DD have been removed in the same manner, two strips AA are provided in the contact layer 16 and partly in the enclosure layer 15 by means of photolithography and the aforementioned etchant consisting of $H_2O$, $H_2O_2$ and $NH_4OH$. The etching process is continued until the enclosure layer 15 between the contact regions has a thickness of only about 0.3 μm. Subsequently, the structure is covered by silicon dioxide, which is provided, for example, by means of sputtering. The oxide layer is then removed again on the mesa-shaped strip and at the area of the gold-germanium-nickel layer with the use of photolithography and usual etchants. Subsequently, the structure is covered by, for example, a titanium-gold layer after which a strip-shaped interruption is provided by means of photolithography and conventional etchants in this layer between the mesa-shaped strips AA and the strip-shaped recesses DD, which interruption prevents the connection conductors 10 and 17 from being electrically connected to each other. As the case may be, silicon dioxide may be provided in these interruptions by means of the aforementioned techniques. After an electrode layer 12 consisting, for example, of a platinum-molybdenum-gold layer or a platinum-tantalum-gold layer or a titanium-gold layer has been provided, for example by means of a sputtering process on the substrate 1, the structure of FIG. 6 is obtained.

The invention is not limited to the embodiments described because many modifications and variations are possible for those skilled in the art within the scope of the invention. For example, other semiconductor materials or other compositions of the chosen semiconductor materials than those mentioned in the embodiments may be used. In this manner, for example, the wavelength of the radiation to be produced may be chosen. Depending upon the desired application, other layer thicknesses may be used. By varying the thickness or the composition of especially the enclosure layer or enclosure layers located between the different groups of active regions, the phase coupling of the radiation beams may be influenced. Inter alia as a result thereof, the angle of the radiation beam in the direction at right angles to the active regions may become considerably smaller, as a result of which a more symmetrical far field may be obtained.

The semiconductor types may also be replaced all (at the same time) by the opposite types. Further, the various active regions need absolutely not necessarily be "index guided"; "gain guiding" may also be used for given applications, inter alia in those cases in which phase coupling is not required or desired. Further, it should especially be noted that the numbers of active regions within one group, the number of groups and the relative positioning of the different groups may advantageously be varied. In the choices that may be made in this respect, inter alia symmetry considerations play an important part. Finally, it should be noted that the methods of limiting the current spread used in the embodiments are not the only possible methods. Without departing from the scope of the invention, the method used here may be replaced by another method.

We claim:

1. A semiconductor diode laser array comprising a semiconductor layer structure arranged on a substrate and having two electrical contacts, two enclosure layers and a number of substantially parallel strip-shaped active regions each located between said two electrical contacts and between said two enclosure layers, said enclosure layers having a larger band gap and a smaller refractive index for the radiation produced than the active region, which active regions are disposed within a resonant cavity and constitute at least two groups located in two substantially equidistant planes, at least one of the groups comprising at least two active regions, characterized in that the active regions of one group are fully separated by at least one of the enclosure layers from the active regions of the other group.

2. A semiconductor array as claimed in claim 1, further comprising means for coupling the radiation beams emanating from said active regions during operation in phase by placing said active regions sufficiently close together to achieve said in-phase coupling.

3. A semiconductor array as claimed in claim 1 or 2, characterized in that the first enclosure layer is provided with mesa-shaped strips, between which strip-shaped channels are provided, and in that each of the active regions of one group is located on a mesa-shaped strip, while each strip-shaped active region of the other group is located on the bottom of a channel.

4. A semiconductor array as claimed in claim 3, characterized in that the strip-shaped channels are wider than the mesa-shaped strips, and in that at the center of the bottom of the strip-shaped channels further strip-shaped channels are provided, which further channels are narrower than the first-mentioned channels and on whose bottom the active regions of a further group are disposed.

5. A semiconductor array as claimed in claim 3, characterized in that the mesa-shaped strips are wider than the strip-shaped channels, and in that at the center of the upper surface of the mesa-shaped strips further strip-shaped channels are provided, which are shallower than the first-mentioned channels and on whose bottom the active regions of a further group are disposed.

6. A semiconductor array as claimed in claim 3, characterized in that the semiconductor substrate consists of gallium arsenide (GaAs), while the first enclosure layer consists of a mixed crystal of aluminum arsenide and gallium arsenide ($Al_xGa_{1-x}As$), and in that the surfaces constituting the edges of the mesa-shaped strips are (111) arsenic crystal surfaces.

7. A semiconductor array as claimed in claim 1 or 2, characterized in that a first enclosure layer is provided on said semiconductor substrate and on this enclosure layer is provided a first active layer, of which the strip-shaped active regions of one group form part, which active layer is covered by a second enclosure layer, on which a second active layer is provided, of which the strip-shaped active regions of the other group form part, which second active layer is covered by a third enclosure layer.

* * * * *